(12) United States Patent
Hong et al.

(10) Patent No.: US 10,461,142 B2
(45) Date of Patent: Oct. 29, 2019

(54) DISPLAY DEVICE

(71) Applicant: Samsung Display Co., Ltd., Yongin-si, Gyeonggi-do (KR)

(72) Inventors: Jong Ho Hong, Yongin-si (KR); Gun Mo Kim, Yongin-si (KR); Jae Min Shin, Yongin-si (KR); Hye Jin Joo, Yongin-si (KR); Min Woo Kim, Yongin-si (KR); Seung Bae Kang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/792,278

(22) Filed: Oct. 24, 2017

(65) Prior Publication Data

US 2018/0114825 A1   Apr. 26, 2018

(30) Foreign Application Priority Data

Oct. 26, 2016   (KR) .................. 10-2016-0140234

(51) Int. Cl.
*H01L 51/00* (2006.01)
*H01L 27/32* (2006.01)
*H01L 51/52* (2006.01)

(52) U.S. Cl.
CPC ........ *H01L 27/3276* (2013.01); *H01L 27/322* (2013.01); *H01L 27/326* (2013.01); *H01L 27/3258* (2013.01); *H01L 51/0096* (2013.01); *H01L 51/0097* (2013.01); *H01L 51/5253* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| 2005/0082530 | A1* | 4/2005 | Koo ................. H01L 29/78615 257/66 |
| 2008/0135837 | A1* | 6/2008 | Kim .................... H01L 29/4908 257/40 |
| 2010/0330338 | A1* | 12/2010 | Boyce ..................... B29C 59/02 428/156 |
| 2011/0227078 | A1* | 9/2011 | Park ........................ H01L 27/12 257/59 |
| 2014/0055440 | A1* | 2/2014 | Cho ......................... G09G 3/36 345/212 |
| 2016/0268352 | A1 | 9/2016 | Hong et al. |

* cited by examiner

*Primary Examiner* — Benjamin P Sandvik
*Assistant Examiner* — Herve-Louis Y Assouman
(74) *Attorney, Agent, or Firm* — Innovation Counsel LLP

(57) ABSTRACT

The present inventive concept relates to a display device. A display device according to an exemplary embodiment of the present inventive concept include: a base layer including a plurality of islands in which a pixel is disposed, a plurality of bridges disposed around each of the plurality of islands, a plurality of first wires disposed in a bridge of the plurality of bridges connected to the pixel is disposed; an inorganic insulating layer disposed on the base layer and having an opening exposing a portion of the bridge; and an organic material layer covering the opening, wherein adjacent islands of the plurality of islands are connected to each other through at least the bridge of the plurality of bridges, and the plurality of first wires are disposed on the organic material layer.

20 Claims, 12 Drawing Sheets

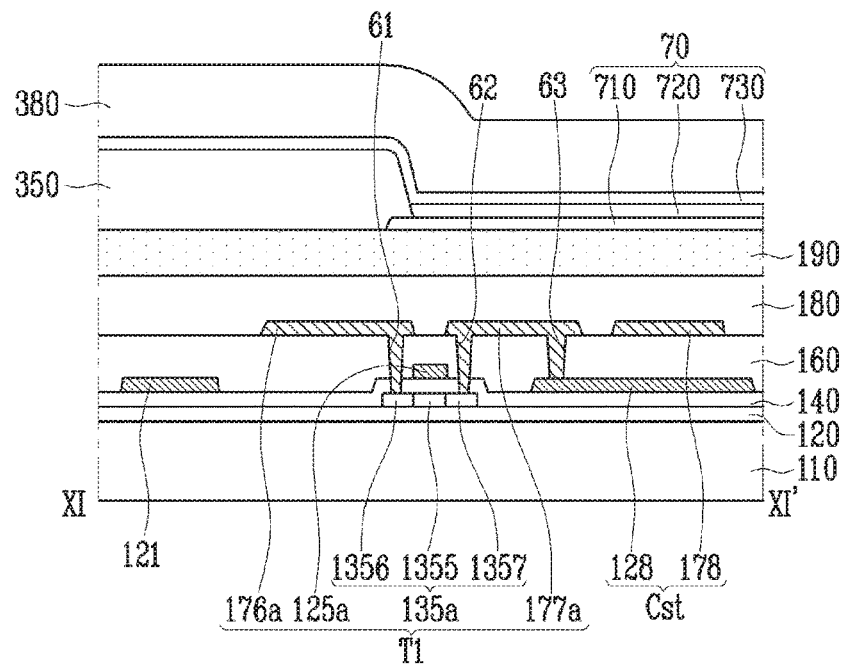
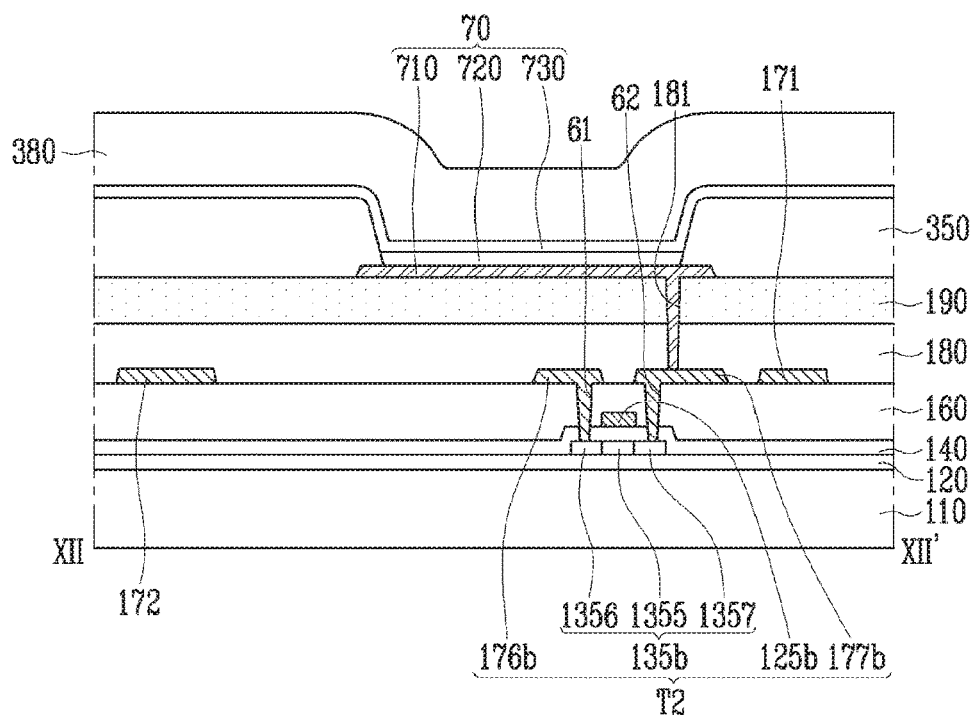

DISPLAY DEVICE

CROSS-REFERENCE TO RELATED APPLICATION

This application claims priority to and the benefit of Korean Patent Application No. 10-2016-0140234 filed in the Korean Intellectual Property Office on Oct. 26, 2016, the entire contents of which are incorporated herein by reference.

BACKGROUND OF THE INVENTION

1. Field of the Invention

The present inventive concept relates to a display device.

2. Description of the Related Art

Currently, widely known display devices include a liquid crystal display (LCD), a plasma display panel (PDP), an organic light emitting diode (OLED) display, a field effect display (FED), an electrophoretic display, and the like.

The OLED display may have a reduced thickness and weight since it has a self-luminance characteristic and does not require an additional light source, unlike a liquid crystal display (LCD). In addition, the OLED display is receiving attention as a next generation display device since it features high quality characteristics, such as low power consumption, high luminance, and high response speed.

Recently, a bendable, foldable, or extensible display device has been developed. Particularly, in a stretchable display device, since light emitting elements are formed on a stretchable substrate, when the stretchable substrate is stretched, the light emitting elements or wires stacked on an upper portion of the stretchable substrate may be damaged.

SUMMARY OF THE INVENTION

An exemplary embodiment of the present inventive concept provides an organic light emitting diode (OLED) display capable of preventing a light emitting element provided in a stretchable display from being damaged even though the stretchable display is repeatedly extended or contracted.

In addition, an exemplary embodiment of the present inventive concept provides an OLED display capable of preventing a wire from being cut even though the stretchable display is repeatedly extended or contracted.

A display device according to an exemplary embodiment of the present inventive concept include: a base layer including a plurality of islands in which a pixel is disposed, a plurality of bridges disposed around each of the plurality of islands, a plurality of first wires disposed in a bridge of the plurality of bridges connected to the pixel is disposed; an inorganic insulating layer disposed on the base layer and having an opening exposing a portion of the bridge; and an organic material layer covering the opening, wherein adjacent islands of the plurality of islands are connected to each other through at least the plurality of bridges, and the plurality of first wires are disposed on the organic material layer.

In addition, an island of the plurality of islands may have a quadrangle shape, and the bridge may be connected to each side of the island.

In addition, the bridge may include a curved portion, and the curved portion may be disposed at one side of the island.

In addition, the curved portion may have a predetermined curvature radius.

In addition, the base layer further may include a peripheral region connected to each side of the island.

In addition, a slit may be formed between the peripheral region disposed at one side of the island and the bridge, and the slit may include a curved portion.

In addition, the inorganic insulating layer may include a buffer layer, a gate insulating layer, and an interlayer insulating layer sequentially stacked.

In addition, the pixel may include a transistor, and the transistor may include a semiconductor layer disposed on the buffer layer; a gate electrode disposed on the gate insulating layer; and a source electrode and a drain electrode disposed on the interlayer insulating layer.

In addition, the plurality of first wires includes the same material as a material included in the source electrode and the drain electrode.

In addition, an exemplary embodiment may further include a first conductive layer disposed on the gate insulating layer, and a second conductive layer disposed on the interlayer insulating layer.

In addition, the plurality of first wires may include the same material as a material included in the second conductive layer.

In addition, an elongation of the second conductive layer may be larger than an elongation of the first conductive layer.

In addition, the organic material layer may cover an edge of the inorganic insulating layer.

In addition, the plurality of first wires may extend from an upper portion of the organic material layer to an upper portion of the interlayer insulating layer.

In addition, the plurality of first wires may be disposed only on the organic material layer, and the plurality of first wires may be electrically connected to the second conductive layer through the first conductive layer.

In addition, the plurality of first wires may be connected to the first conductive layer through a first contact hole, and the first conductive layer may be connected to the second conductive layer through a second contact hole.

In addition, an exemplary embodiment may further include a first protection layer disposed on the interlayer insulating layer and the plurality of first wires.

In addition, the pixel may further include an organic light emitting diode (OLED), and the OLED includes a first pixel electrode disposed on the first protection layer on the interlayer insulating layer; an organic emission layer disposed on the first pixel electrode; and a second pixel electrode disposed on the organic emission layer.

In addition, the second pixel electrode may be integrally formed corresponding to a shape of the base layer, and may be connected to at least one of the plurality of first wires through a contact hole formed in the first protection layer on the plurality of first wires.

In addition, a first pixel for displaying a first color, a second pixel for displaying a second color, and a third pixel for displaying a third color may be disposed on each of the plurality of islands.

An exemplary embodiment of the present inventive concept may provide an organic light emitting diode (OLED) display capable of preventing a light emitting element stacked on a stretchable display from being damaged even though the stretchable display is repeatedly extended or contracted.

In addition, an exemplary embodiment of the present inventive concept provides an OLED display capable of preventing a wire from being cut even though the stretchable display is repeatedly extended or contracted.

BRIEF DESCRIPTION OF THE DRAWINGS

FIG. 7 is a cross-sectional view taken along a line XI-XI' of FIG. 6.

FIG. 8 is a cross-sectional view taken along a line XII-XII' of FIG. 6.

DETAILED DESCRIPTION OF THE EMBODIMENTS

Particularities of other embodiments are included in the detailed description and drawings.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). In order to clarify the present inventive concept, parts not related to the description are omitted from the drawings, and the same reference numbers are used throughout the drawings to refer to the same or like parts.

Hereinafter, an OLED display according to an exemplary embodiment of the present inventive concept will be described with reference to drawings associated with exemplary embodiments of the present inventive concept.

Figure 1:
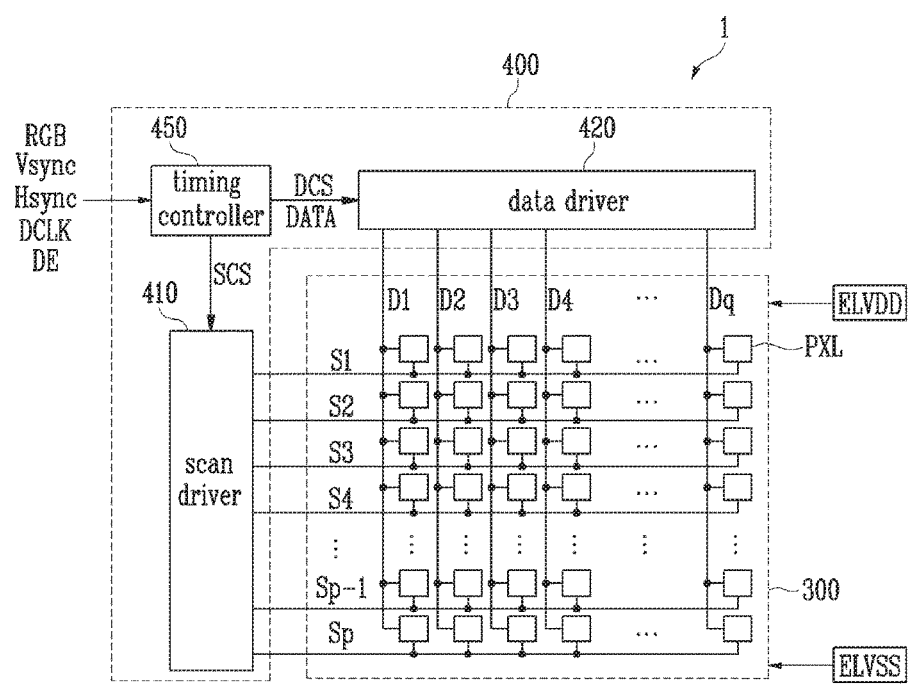
FIG. 1 is a block diagram schematically illustrating a configuration of an organic light emitting diode (OLED) display according to an exemplary embodiment of the present inventive concept.

FIG. 1 is a block diagram schematically illustrating a configuration of an OLED display according to an exemplary embodiment of the present inventive concept.

Referring to FIG. 1, an OLED display 1 according to an exemplary embodiment of the present inventive concept may include a display panel 300 and display driver 400.

The display panel 300 may include a plurality of pixels PXL, a plurality of data lines D1 through Dq and a plurality of scan lines S1 through Sp connected to the pixels PXL.

Each of the pixels PXL may respectively receive a data signal and a scan signal through the data lines D1 through Dq and the scan lines S1 through Sp.

In addition, the pixels PXL may be connected to a first power ELVDD and a second power ELVSS.

The pixels PXL may include a light emitting element (e.g., an organic light emitting diode), and may generate light corresponding to a data signal by a current flowing from the first power ELVDD via the light emitting element to the second power ELVSS.

The display driver 400 may include a scan driver 410, a data driver 420, and a timing controller 450.

The scan driver 410 may supply scan signals to the scan lines S1-Sp in response to a scan driver control signal SCS. For example, the scan driver 410 may sequentially supply the scan signals to the scan lines S1 through Sp.

The scan driver 410 may be mounted directly on the base layer on which the pixels PXL are formed, or may be connected to the base layer through a separate element such as a substrate supporting the base layer or a flexible circuit board for connection with the scan lines S1 through Sp.

The data driver 420 may receive a data driver control signal DCS and an image data DATA from the timing controller 450 to generate the data signal.

The data driver 420 may supply the generated data signal to the data lines D1 through Dq.

The data driver 420 may be mounted directly on the base layer on which the pixels PXL are formed, or may be connected to the base layer through a separate constituent element such as a substrate supporting the base layer or a flexible circuit board for connection with the data lines D1 through Dq.

When a scan signal is supplied to a specific scan line, some of the pixels PXL connected to the specific scan line may receive a data signal transmitted from the data lines D1-Dq, and the some of the pixels PXL may emit light with a luminance corresponding to the received data signal.

The timing controller 450 may generate control signals for controlling the scan driver 410 and the data driver 420.

For example, the control signals may include a scan driver control signal SCS for controlling the scan driver 410, and a data driver control signal DCS for controlling the data driver 420.

At this time, the timing controller 450 may generate the scan driver control signal SCS and the data driver control signal DCS by using the external input signal.

For example, the external input signal may include a dot clock DCLK, a data enable signal DE, a vertical synchronization signal Vsync, and a horizontal synchronization signal Hsync.

In addition, the timing controller 450 may supply the scan driver control signal SCS to the scan driver 410 and the data driver control signal DCS to the data driver 420.

The timing controller 450 may convert image data RGB inputted from the outside into image data DATA according to specifications of the data driver 420, and may supply the image data DATA to the data driver 420.

The data enable signal DE is a signal defining a period during which effective data is inputted, and one period may be set to one horizontal period such as the horizontal synchronizing signal Hsync.

Although the scan driver 410, the data driver 420, and the timing controller 450 are separately shown in FIG. 1, at least some of the constituent elements may be integrated as necessary.

In addition, the scan driver 410, the data driver 420, and the timing controller 450 may be installed in various ways such as a chip on glass (COG), a chip on plastic (COP), a tape carrier package (TCP), a chip on film (COF), and the like.

Figure 2:
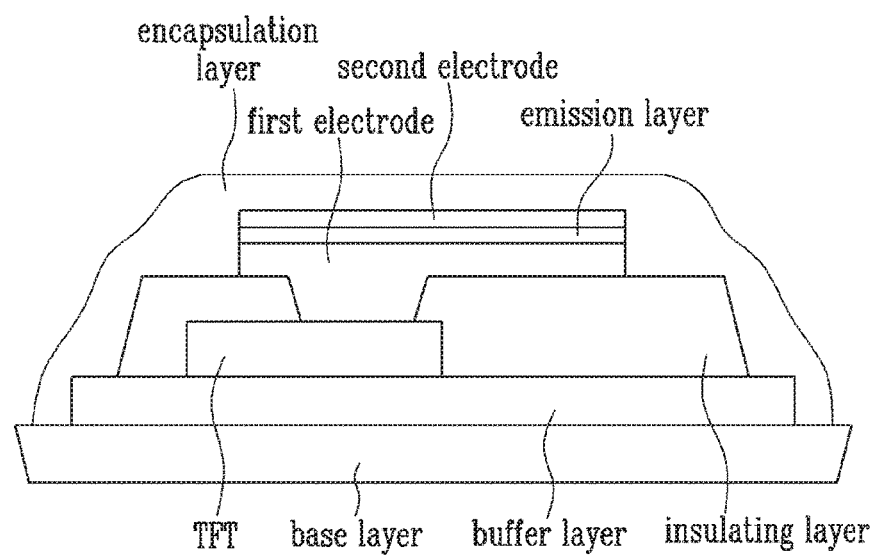
FIG. 2 is a cross-sectional view schematically illustrating a pixel structure provided in an organic light emitting diode display in FIG. 1.

FIG. 2 is a cross-sectional view schematically illustrating a pixel structure provided in an organic light emitting diode display in FIG. 1.

Referring to FIG. 2, the pixel PXL may include a base layer, a thin film transistor, a first electrode, an emission layer, a second electrode, and the like. The thin film transistor, the first electrode, the emission layer, and the second electrode may be main elements configuring the OLED display.

Figure 3:
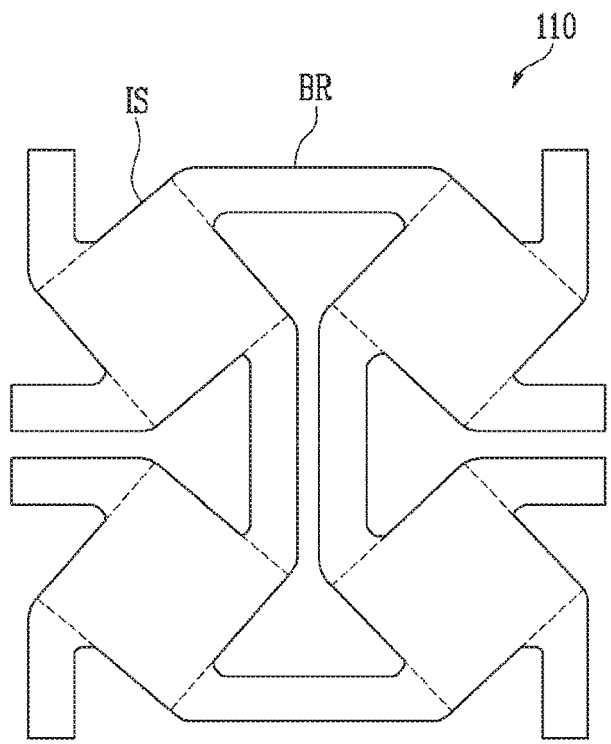
FIG. 3 is a plan view of a base layer in an OLED display according to an exemplary embodiment of the present inventive concept.

First, the base layer 110 may be formed in a structure to be stretchable. FIG. 3 is a plan view of a base layer in an OLED display according to an exemplary embodiment of the present inventive concept.

Referring to FIG. 3, the base layer 110 may be an island. The base layer 110 may include a plurality of islands IS and a plurality of bridges BR.

Specifically, the plurality of islands IS may be regularly arranged in a first axis (x axis) direction and a second axis (y axis) direction. In addition, adjacent islands IS may be connected to each other through at least one of bridges BR.

A pixel structure (e.g., a thin film transistor, a capacitor, an OLED, or the like) may be formed on each island IS, and one pixel PXL or a plurality of pixels PXL may be formed thereon.

Wires for supplying a power source voltage, a data signal, a scan signal, and the like to the pixel structure may be formed on each bridge BR.

When the base layer 110 is stretched, a distance between the islands IS may be increased or decreased. In this case, a shape of each island IS may not be varied. That is, a width and a height of the island IS may not be increased or decreased. Therefore, a structure of the pixel PXL disposed on the island IS may be not varied.

However, the bridges BR connecting the islands IS may be varied when the base layer 110 is stretched.

Meanwhile, although each island IS is shown as being a quadrangle in FIG. 3, the present inventive concept is not limited thereto, and a shape of the island IS may be variously changed. In addition, a shape of the bridge BR connecting the island IS may be variously changed without being limited to the shape shown in FIG. 3.

Figure 4:
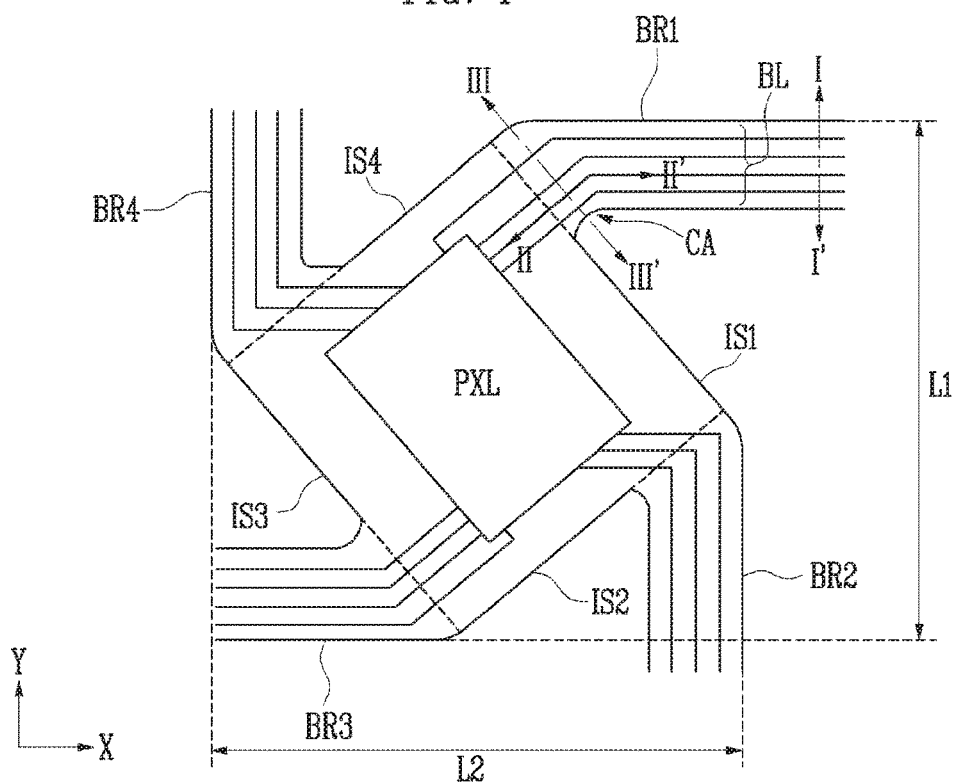
FIG. 4 is an enlarged plan view of one island and a portion of bridges connected thereto shown in FIG. 3.

FIG. 4 is an enlarged plan view of one island and a portion of bridges connected thereto shown in FIG. 3.

Referring to FIG. 4, the island IS may have a quadrangle shape surrounded by a first side IS1 through a fourth side IS4.

A pixel PXL may be formed on the island IS, one pixel PXL may be formed on one island IS, or a plurality of pixels PXL may be formed on one island IS. For example, a red pixel R, a green pixel G, and a blue pixel B may be disposed on one island IS.

A first bridge BR1 through a fourth bridge BR4 may be respectively connected to the first side IS1 through the fourth side IS4 of the island IS.

The first bridge BR1 may be connected to a portion of the first side IS1, and may be formed so as to extend in a first direction (an x-axis direction). The first bridge BR1 may include a curved portion CA disposed at a portion connected to the first side IS1.

The second bridge BR2 may be connected to a portion of the second side IS2 and may be formed so as to extend in a second direction (a y-axis direction). The second bridge BR2 may include a curved portion CA disposed at a portion connected to the second side IS2.

The third bridge BR3 may be connected to a portion of the third side IS3, may be formed so as to extend in the first direction (the x-axis direction), and may be formed so as to extend in an opposite direction to the direction in which the first bridge BR1 extends. The third bridge BR3 may include a curved portion CA disposed at a portion connected to the third side IS3.

The fourth bridge BR4 may be connected to a portion of the fourth side IS4, may be formed so as to extend in the second direction (the y-axis direction), and may be formed so as to extend in an opposite direction to the direction in which the second bridge BR2 extends. The fourth bridge BR4 may include a curved portion CA disposed at a portion connected to the fourth side IS4.

First wirings BL for supplying a driving voltage, a scan signal, a data signal, and the like to the pixels PXL formed on the island IS may be formed on each of the bridges BR1 through BR4.

The number of the first wires BL disposed on each of the bridges BR1 through BR4 may be variously changed according to the number of the pixels PXL formed on the island IS, and may be variously changed according to the number of transistors forming the pixel PXL, and the like.

In addition, the number of the first wires BL disposed on each of the bridges BR1 through BR4 may be the same or different.

The structure of the first wire BL formed on the bridges BR1 through BR4 will be described in detail below with reference to FIGS. 9 to 11.

Figure 5:
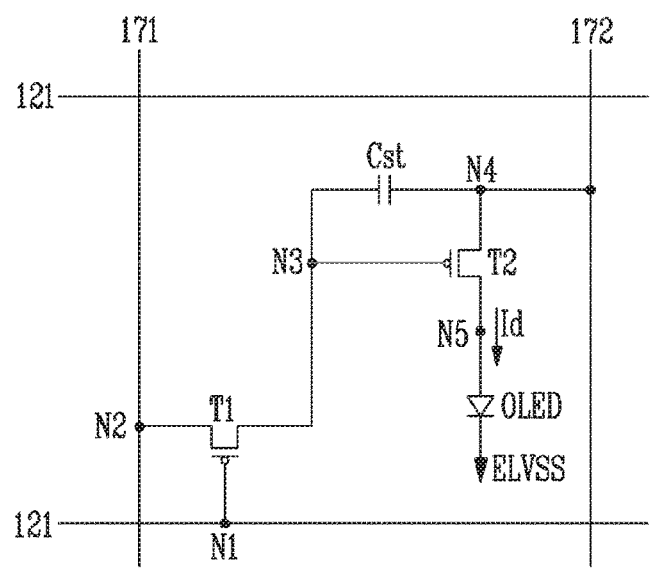
FIG. 5 is an equivalent circuit diagram of a pixel according to an exemplary embodiment of the present inventive concept.
Figure 6:
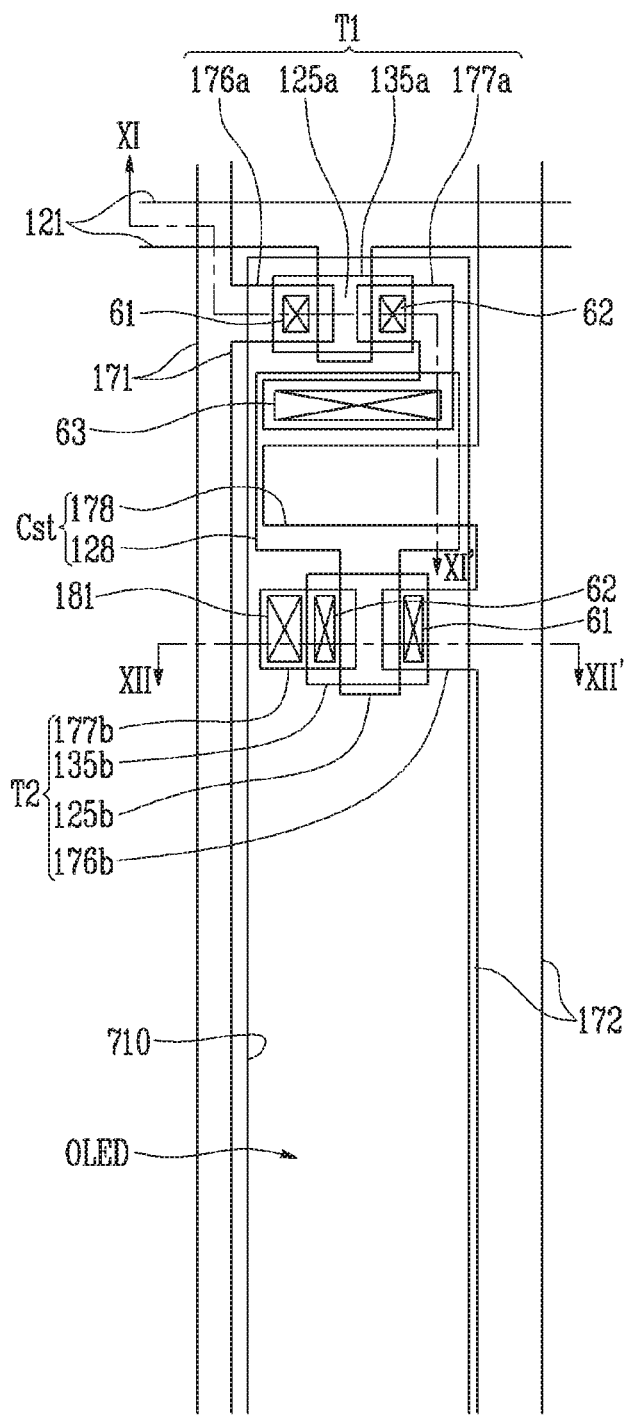
FIG. 6 is a plan view of a pixel shown in FIG. 5.

FIG. 5 is an equivalent circuit diagram of a pixel according to an exemplary embodiment of the present inventive concept, FIG. 6 is a plan view of a pixel shown in FIG. 5, FIG. 7 is a cross-sectional view taken along a line XI-XI' of FIG. 6, and FIG. 8 is a cross-sectional view taken along a line XII-XII' of FIG. 6.

Hereinafter, a structure of the pixel PXL formed on the island IS will be described in detail with reference to FIGS. 5 through 8.

First, an equivalent circuit diagram of the pixel PXL formed on the island IS will be described with reference to FIG. 5.

As shown in FIG. 5, the pixel PXL may include a scan line 121 for transmitting a scan signal, a data line 171 for transmitting a data signal, and a driving voltage line 172 for transmitting a driving voltage.

The scan line 121 shown in FIG. 5 may be any one of the scan lines S1 through Sp shown in FIG. 1, the data line 171 may be any one of the data lines D1 through Dq shown in FIG. 1, and the driving voltage line 172 may be a line which supplies the first power ELVDD.

Next, the pixel PXL may include a switching transistor T1, a driving transistor T2, a storage capacitor Cst, and an organic light emitting diode OLED.

The switching transistor T1 may include a gate electrode, a first electrode, and a second electrode, and may be connected to a first node N1, a second node N2, and a third node N3. Specifically, the first electrode of the switching transistor T1 may be connected to the second node N2, the second electrode may be connected to the third node N3, and the gate electrode may be connected to the first node N1.

At this time, the first node N1 may be connected to the scan line 121, the second node N2 may be connected to the data line 171, and the third node N3 may be connected to the driving transistor T2.

The switching transistor T1 may be turned on when the scan signal is supplied from the scan line 121 to supply the data signal received from the data line 171 to the storage capacitor Cst.

At this time, the storage capacitor Cst may charge the voltage corresponding to the data signal.

The driving transistor T2 may include a gate electrode, a first electrode, and a second electrode, and may be connected to a third node N3, a fourth node N4, and a fifth node N5. Specifically, the gate electrode of the driving transistor T2 may be connected to the third node N3, the first electrode may be connected to the fourth node N4, and the second electrode may be connected to the fifth node N5.

At this time, the third node N3 may be connected to the second electrode of the switching transistor T1, the fourth node N4 may be connected to the driving voltage line 172, and the fifth node N5 may be connected to an anode electrode of the organic light emitting diode OLED.

The driving transistor T2 may control an amount of a current Id flowing from the driving voltage line 172 to the organic light emitting diode OLED in response to the voltage value stored in the storage capacitor Cst.

The organic light emitting diode OLED may include an anode electrode connected to the second electrode of the driving transistor T2 and a cathode electrode connected to the second power ELVSS.

The organic light emitting diode OLED may generate light corresponding to the amount of the current Id supplied from the driving transistor T2.

The organic light emitting diode OLED may include an organic material which represents one or more primary colors, including three of red, green, and blue, and the OLED display 1 may display a desired image with a spatial sum of these colors.

In FIG. 5, the first electrode of the transistors T1 and T2 may be set to one of a source electrode and a drain electrode, and the second electrode of the transistors T1 and T2 may be set to a different electrode from the first electrode. For example, if the first electrode is set to the source electrode, the second electrode may be set to the drain electrode.

In addition, the transistors T1 and T2 are illustrated as being PMOS transistors in FIG. 5, but the transistors T1 and T2 may be implemented as NMOS transistors in other exemplary embodiment.

Since the structure of the pixel PXL shown in FIG. 5 is only an exemplary embodiment of the present inventive concept, the pixel PXL of the present inventive concept is not limited to the above structure. In practice, the pixel PXL may have a circuit structure capable of supplying a current to the organic light emitting diode OLED, and may be selected from any one of various structures currently known.

That is, in addition to the switching transistor T1 and the driving transistor T2 shown in FIG. 5, the pixel PXL may further include an additional transistor and a capacitor for compensating the current supplied to the organic light emitting diode OLED.

Meanwhile, the first power ELVDD supplied through the driving voltage line 172 may be a high voltage, and the second power ELVSS may be a low voltage.

For example, the first power ELVDD may be set to a positive voltage, and the second power ELVSS may be set to a negative voltage or a ground voltage.

Hereinafter, a stacked structure of the pixels PXL formed on the island IS will be described in detail with reference to FIGS. 6 through 8.

The base layer 110 may be made of polyamide, polyamide, polyacrylates, or the like.

A buffer layer 120 including an inorganic material such as silicon oxide, silicon nitride, and/or silicon oxynitride may be disposed on the base layer 110, The buffer layer 120 may serve to increase a flatness of an upper surface of the base layer 110, and may serve to prevent or minimize impurities in the base layer 110 or the like from permeating into the semiconductor layer 135a of the thin film transistor T1.

The buffer layer 120 may have a single-layer structure or a multi-layer structure.

A switching semiconductor layer 135a and a driving semiconductor layer 135b may be formed on the buffer layer 120 to be separated from each other.

These semiconductor layers 135a and 135b may be made of polysilicon or an oxide semiconductor.

The oxide semiconductor may include at least one selected from one oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

When the semiconductor layers 135a and 135b are made of an oxide semiconductor, a separate passivation layer may be added to protect the oxide semiconductor that is vulnerable to an external environment, such as high temperature and the like.

Each of the switching semiconductor layer 135a and the driving semiconductor layer 135b may include a channel region 1355 in which impurities are not doped, and a source region 1356 and a drain region 1357 in which impurities are doped at opposite sides of the channel region 1355. In this case, the doped impurities may be changed depending on types of the thin film transistors, and may be n-type or p-type impurities.

The channel regions 1355 of the switching semiconductor layer 135a and the driving semiconductor layer 135b may include polysilicon that is not doped with the impurities, that is, an intrinsic semiconductor.

In addition, the source and drain regions 1356 and 1357 of the switching semiconductor layer 135a and the driving semiconductor layer 135b may include polysilicon that is doped with conductive impurities, that is, an impurity semiconductor.

A gate insulating layer 140 is formed on the switching semiconductor layer 135a and the driving semiconductor layer 135b for securing insulation with the gate electrode. The gate insulating layer 140 may be a single layer or a multiple layer including an inorganic material such as silicon oxide, silicon nitride, and/or silicon oxynitride.

The gate line 121, a switching gate electrode 125a protruding from the gate line 121, a first capacitor electrode 128, and a driving gate electrode 125b protruding from the first capacitor electrode 128 may be formed on the gate insulating layer 140.

The gate line 121 and the first capacitor electrode 128 formed on the gate insulating layer 140 may be made of metal.

The metal may include molybdenum (Mo), and may include at least one selected from gold (Au), silver (Ag), aluminum (Al), chromium (Cr), titanium (Ti), nickel (Ni), neodymium (Nd), copper (Cu), or an alloy thereof.

In addition, the gate line 121 may be formed of a single layer, but not limited thereto. The gate line 121 may be formed of a multiple layer in which two or more materials of metals and alloys are stacked.

In an exemplary embodiment of the present inventive concept, other wires may be disposed with the same material in the same layer as the gate line 121 and the first capacitor electrode 128.

The gate line 121 may extend in a horizontal direction, and may transmit the scan signal to the switching transistor T1. In this case, the gate line 121 may include a switching gate electrode 125a which protrudes toward the switching semiconductor layer 135a.

The driving gate electrode 125b protrudes toward the driving semiconductor layer 135b from the first capacitor electrode 128.

Each of the switching gate electrode 125a and the driving gate electrode 125b overlaps the channel region 1355.

Meanwhile, an interlayer insulating layer 160 may be disposed on the gate line 121, the switching gate electrode 125a, the first capacitor electrode 128, and the driving gate electrode 125b.

The interlayer insulating layer 160 may include an inorganic material such as silicon oxide, silicon nitride, and/or silicon oxynitride.

A source contact hole 61 and a drain contact hole 62 may be formed in the interlayer insulating layer 160 and the gate insulating layer 140 to respectively expose the source region 1356 and the drain region 1357.

In addition, a storage contact hole 63 may be formed in the interlayer insulating layer 160 to expose one portion of the first capacitor electrode 128.

A data line 171 having a switching source electrode 176a, a driving voltage line 172 having a driving source electrode 176b and a second capacitor electrode 178, and a switching drain electrode 177a and a driving drain electrode 177b connected to the first capacitor electrode 128 are formed on the interlayer insulating layer 160.

The electrodes (or the wires) disposed on the interlayer insulating layer 160 may be made of metal. For example, the electrodes (or the wires) may be made of at least one selected from metals such as gold (Au), silver (Ag), aluminum (Al), molybdenum (Mo), chromium (Cr), titanium (Ti), nickel (Ni), neodymium (Nd), copper (Cu), or an alloy of metals. In addition, the electrodes (or the wires) may be formed of a single layer, but not limited thereto, and may be formed of a multiple layer in which two or more materials of metals and alloys are stacked.

Although not shown in the drawing, other electrodes (or wires) may be disposed on the interlayer insulating layer 160 in addition to the data line 171, the driving voltage line 172, and the like, and the other electrodes (or the wires) may be made of the same material as the data line 171, the voltage line 172, and the like.

The data line 171 may transmit the data signal, and may extend to cross the gate line 121. The driving voltage line 172 may be a line for transmitting a driving voltage, may be separated from the data line 171, and may extend in parallel with the data line 171.

The switching source electrode 176a may protrude toward the switching semiconductor layer 135a from the data line 171, and the driving source electrode 176b may protrude toward the driving semiconductor layer 135b from the driving voltage line 172.

Each of the switching source electrode 176a and the driving source electrode 176b may be connected to the source region 1356 through the source contact hole 61.

The switching drain electrode 177a may face the switching source electrode 176a, and the driving drain electrode 177b may face the driving source electrode 176b.

Each of the switching drain electrode 177a and the driving drain electrode 177b may be connected to the drain region 1357 through the drain contact hole 62.

The switching drain electrode 177a may extend to be electrically connected to the first capacitor electrode 128 and the driving gate electrode 125b through the contact hole 63 formed in the interlayer insulating layer 160.

The second capacitor electrode 178 may protrude from the driving voltage line 172 to overlap the first capacitor electrode 128. Accordingly, the first capacitor electrode 128 and the second capacitor electrode 178 may form the storage capacitor Cst using the interlayer insulating layer 160 as a dielectric material.

The switching semiconductor layer 135a, the switching gate electrode 125a, the switching source electrode 176a, and the switching drain electrode 177a may form a switching transistor T1.

The driving semiconductor layer 135b, the driving gate electrode 125b, the driving source electrode 176b, and the driving drain electrode 177b may form a driving transistor T2.

The switching transistor T1 and the driving transistor T2 correspond to switching elements.

A passivation layer 180 may be disposed on the switching source electrode 176a, the driving source electrode 176b, the switching drain electrode 177a, and the driving drain electrode 177b. The passivation layer 180 may be an inorganic insulating layer made of an inorganic material.

The inorganic material may include polysiloxane, silicon nitride, silicon oxide, silicon oxynitride, or the like.

The passivation layer 180 may be omitted according to the embodiment.

A first protection layer 190 may be formed on the passivation layer 180.

The first protection layer 190 may be an organic insulating layer made of an organic material. The organic material may include an organic insulating material such as a polyacrylic compound, a polyimide compound, a fluorocarbon compound such as Teflon, a benzocyclobutene compound, or the like.

A first pixel electrode 710 may be formed on the first protection layer 190.

The first pixel electrode 710 may be made of a transparent conductive material such as indium tin oxide (ITO), indium zinc oxide (IZO), zinc oxide (ZnO), indium oxide ($In_2O_3$), or the like, or reflective metal such as lithium, calcium, lithium fluoride/calcium (LiF/Ca), lithium fluoride/aluminum (LiF/Al), aluminum (Al), silver (Ag), magnesium (Mg), gold (Au), or the like.

Meanwhile, the first pixel electrode 710 may be electrically connected to the driving drain electrode 177b of the driving transistor T2 through a contact hole 181 formed in the interlayer insulating layer 160, and may become an anode of the organic light emitting diode 70.

A pixel definition layer 350 may be formed on an edge portion of the first protection layer 190 and the first pixel electrode 710. The pixel definition layer 350 may include an opening which exposes the first pixel electrode 710. That is, the pixel definition layer 350 may partition a pixel area to correspond to each pixel.

The pixel definition layer 350 may be an organic insulating layer made of an organic material.

The organic material may include an organic insulating material such as a polyacryl-based compound, a polyimide-based compound, a fluorocarbon compound such as Teflon, a benzocyclobutene compound, or the like.

An organic emission layer 720 may be disposed in the opening of the pixel definition layer 350.

The organic emission layer 720 may include a low-molecule material or a high-molecule material. The low-molecule material may include copper phthalocyanine (CuPc), N,N-Di(naphthalen-1-yl)-N,N'-diphenyl-benzidine (NPB), tris-8-hydroxyquinoline aluminum (Alq3), or the like. These materials may be formed by using a vacuum deposition. The high-molecule material may include PEDOT, poly-phenylenevinylene (PPV), polyfluorene, or the like.

The organic emission layer 720 may be formed of a single layer, but may be formed of a multiple layer including various functional layers. In the case where the organic emission layer 720 is formed of a multiple layer, the organic emission layer 720 may have a stacked structure including one or more of a hole injection layer (HIL), a hole transport layer (HTL), an emission layer, an electron transport layer (ETL), an electron injection layer (EIL), and the like.

In the case where the organic emission layer 720 includes all of the above layers, the HIL is disposed on the first pixel electrode 710 serving as the anode, and the HTL, the emission layer, the ETL, and the EIL may be sequentially stacked thereon.

The organic emission layer 720 may be formed by using evaporation, a screen printing, an inkjet printing, a laser induced thermal imaging (LITI), and the like.

The organic emission layer 720 may include a red organic emission layer emitting red light, a green organic emission layer emitting green light, and a blue organic emission layer emitting blue light. The red organic emission layer, the green organic emission layer, and the blue organic emission layer are respectively formed on a red pixel, a green pixel, and a blue pixel to implement a color image.

In addition, the red organic emission layer, the green organic emission layer, and the blue organic emission layer are integrally stacked on the organic emission layer 720 together with the red pixel, the green pixel, and the blue pixel to respectively form a red color filter, a green color filter, and a blue color filter in each pixel so as to implement a color image.

Alternatively, a white organic emission layer emitting white light is formed on all of the red pixel, the green pixel, and the blue pixel, and a red color filter, a green color filter, and a blue color filter are respectively formed for every pixel to implement a color image.

The white organic emission layer described in other exemplary embodiment may be formed to have a single organic emission layer, and may further include a configuration in which a plurality of organic emission layers are stacked to emit white light.

For example, a configuration in which at least one yellow organic emission layer and at least one blue organic emission layer are combined to emit white light, a configuration in which at least one cyan organic emission layer and at least one red organic emission layer are combined to emit white light, and/or a configuration in which at least one magenta organic emission layer and at least one green organic emission layer are combined to emit white light may be further included.

A second pixel electrode 730 may be disposed on the pixel definition layer 350 and the organic emission layer 720.

The second pixel electrode 730 may be made of a metal layer such as silver (Ag), magnesium (Mg), aluminum (Al), platinum (Pt), palladium (Pd), gold (Au), nickel (Ni), neodymium (Nd), iridium (Ir), chromium (Cr), or the like and/or a transparent conductive layer such as indium tin oxide (ITO), indium zinc oxide (IZO), zinc oxide (ZnO), indium tin zinc oxide (ITZO), or the like. In an exemplary embodiment of the present inventive concept, the second pixel electrode 730 may be formed of a multi-layer including a metal thin film, for example, a triple layer of ITO/Ag/ITO.

As described above, the first pixel electrode 710 may be an anode electrode of the organic light emitting diode 70 and the second pixel electrode 730 may be a cathode electrode of the organic light emitting diode 70

However, the first pixel electrode 710 may be a cathode electrode, and the second pixel electrode 720 may be an anode electrode.

The first pixel electrode 710, the organic emission layer 720, and the second pixel electrode 730 form an organic light emitting diode 70.

An encapsulation layer 380 may be provided on the second pixel electrode 730. The encapsulation layer 380 can prevent oxygen and moisture from infiltrating into the light emitting device OLED. The encapsulation layer 380 may include a plurality of inorganic layers (not shown) and/or a plurality of organic layers (not shown). For example, the encapsulation layer 380 may include a plurality unit encapsulation layers including the inorganic layer and the organic layer disposed on the inorganic layer.

Figure 9:
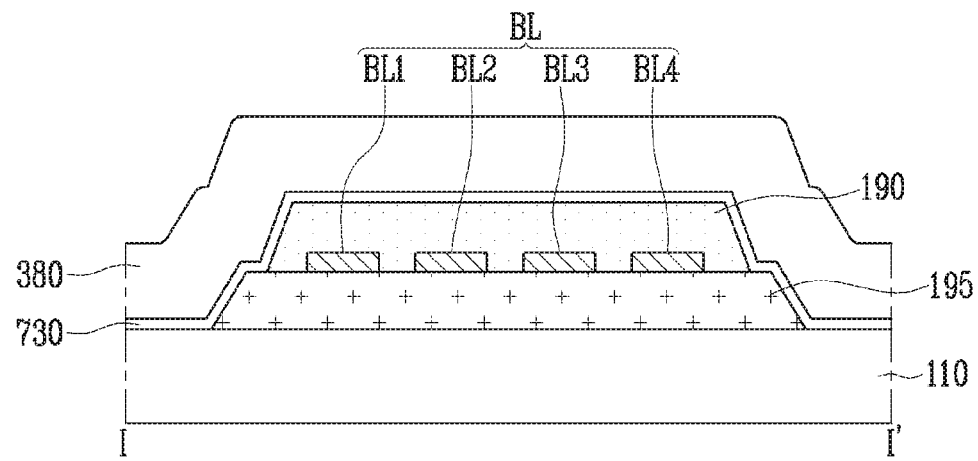
FIG. 9 is a cross-sectional view taken along a line I-I' of FIG. 4.
Figure 10:
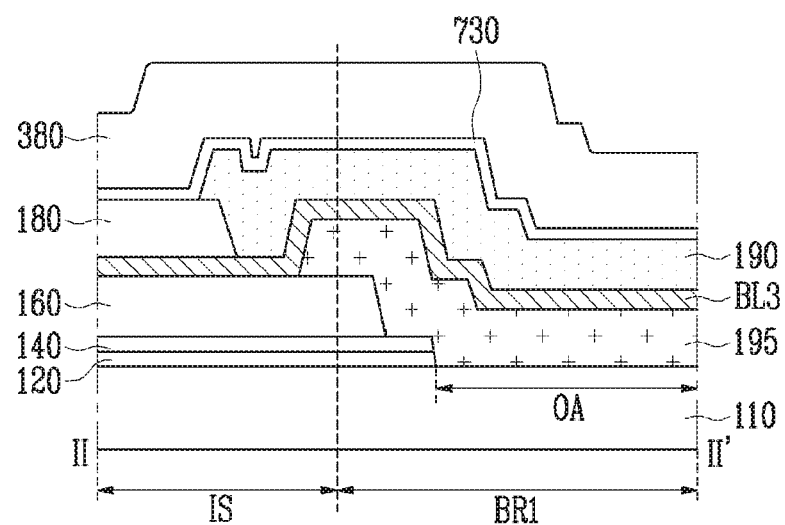
FIG. 10 is a cross-sectional view taken along a line II-II' of FIG. 4.
Figure 11:
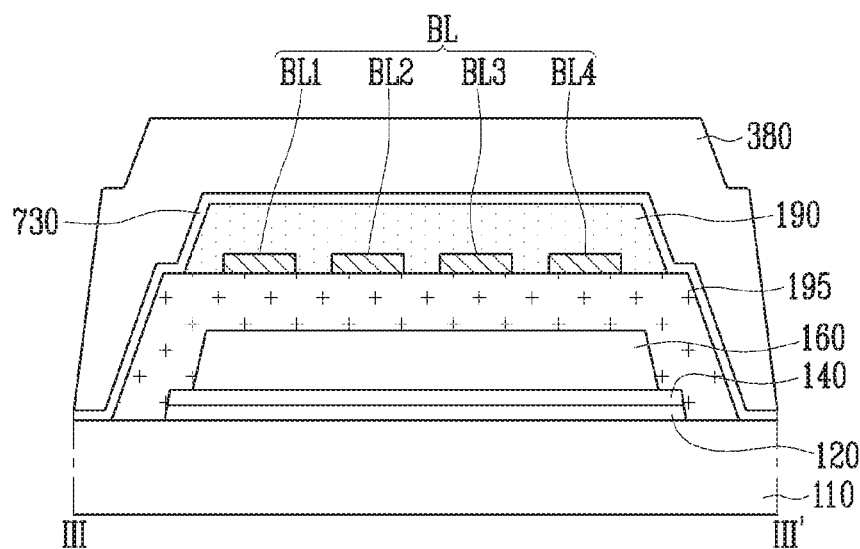
FIG. 11 is a cross-sectional view taken along a line III-III' of FIG. 4.

FIG. 9 is a cross-sectional view taken along a line I-I' of FIG. 4, FIG. 10 is a cross-sectional view taken along a line II-II' of FIG. 4, and FIG. 11 is a cross-sectional view taken along a line III-III' of FIG. 4.

Hereinafter, a stacked structure of the first wires BL formed on the first bridge BR1 will be described in detail with reference to FIGS. 9 to 11.

A second protection layer 195 may be disposed on the base layer 110.

The buffer layer 120, the gate insulating layer 140, and the interlayer insulating layer 160 may have a opening OA exposing the bridge BR1 of the base layer 110.

That is, most of the buffer layer 120, the gate insulating layer 140, and the interlayer insulating layer 160 may be disposed on the island IS, and only a portion of the buffer layer 120, the gate insulating layer 140, and the interlayer insulating layer 160 may be disposed on the bridge BR1.

The second protection layer 195 may cover the opening OA, and may cover the edges of the buffer layer 120, the gate insulating layer 140, and the interlayer insulating layer 160.

The second protection layer 195 may be an organic insulating layer made of an organic material. The organic material may include an organic insulating material such as a polyacryl-based compound, a polyimide-based compound, a fluorocarbon compound such as Teflon, a benzocyclobutene compound, or the like.

A plurality of first wires BL1 through BL4 may be formed on the second protection layer 195.

The first wires BL1 through BL4 disposed on the bridge BR1 extend along a shape of the bridge BR1.

In addition, the first wires BL1 through BL4 disposed on the bridge BR1 may extend to the island IS. The first wires BL1 through BL4 extending to the island IS may be disposed on the interlayer insulating layer 160.

The first wires BL1 through BL4 extending from the bridge BR1 to the island IS may be connected to some of the electrodes/wires disposed on the interlayer insulating layer 160, and may be electrically connected to some of the electrodes/wires disposed on the gate insulating layer 140.

The first wires BL1 through BL4 may be formed of the same material as the source electrode 176a and 176b of the transistor, the data line 171, the second capacitor electrode 178, the driving voltage line 172, the drain electrode 177a and 177b of the transistor, and the like on the interlayer insulating layer 160.

The first protection layer 190 may be formed on the first wires BL1 through BL4.

The first protection layer 190 disposed on the bridge BL1 may extend to the island IS, and may cover an edge of the passivation layer 180.

That is, the first protection layer 190 may cover one portion of the first wires BL1 through BL4, and the passivation layer 180 may cover the rest portion.

The second pixel electrode 730 may be disposed on the first protection layer 190, and the second pixel electrode 730 may cover the base layer 110, the second protection layer 195, and the first protection layer 190.

The encapsulation layer 380 may be provided on the second pixel electrode 730

The buffer layer 120, the gate insulating layer 140, and the interlayer insulating layer 160 including an inorganic material, may be collectively referred to as an inorganic insulating layer. In addition, the first protection layer 190 and the second protection layer 195 may be collectively referred to as an organic material layer.

According to an exemplary embodiment of the present inventive concept, the inorganic insulating layer has the opening OA corresponding to the bridge BR, and the bridge BR has an organic material layer filling at least a portion of the opening OA.

In addition, the first wire BL extends to the island IS via the bridge BR, and the first wire BL is disposed on the organic material layer at the bridge BR.

The first wire BL may be formed simultaneously with the same material as a source electrode and a drain electrode of a transistor.

The organic light emitting diode (OLED) display 1 according to the present inventive concept is stretchable, and if the inorganic insulating layer does not have the opening OA in the bridge BR and has a continuous shape from the island IS to the bridge BR, and the first wire BL is disposed on the inorganic insulating layer at the bridge BR, a large tensile stress is applied to the first wire BL when the base layer 110 is stretched.

Particularly, since the inorganic insulating layer has a higher hardness than the organic material layer, there is a high probability that cracks and the like will occur in the inorganic insulation layer disposed in the bridge BR. When cracks and the like occur in the inorganic insulating layer, cracks and the like also occur in the first wire BL on the inorganic insulating layer, and a probability of occurrence of defects such as a disconnection of the first wire BL becomes very high.

However, in the case of the display device according to the present exemplary embodiment, the inorganic insulating layer is mainly disposed on the island IS of the base layer 110, which is less stressed, and is disposed at a minimum on the stressed bridge BR when the base layer 110 is stretched, so the first wire BL is disposed on the organic material layer at the bridge BR.

Since the organic material layer has a low probability of cracking due to the characteristics of the organic material, it is possible to prevent cracks and the like from occurring in the first wire BL disposed on the organic material layer or to minimize the occurrence probability thereof.

Since a hardness of the organic material layer is lower than a hardness of the inorganic insulating layer, the organic material layer may absorb tensile stress applied to the base layer 110, and therefore concentration of tensile stress on the first wire BL may be minimized effectively.

The electrodes/wires formed on the gate insulating layer 140 may be collectively referred to as a first conductive layer. In addition, the electrodes/wires formed on the interlayer insulating layer 160 may be collectively referred to as a second conductive layer.

According to an exemplary embodiment of the present inventive concept, the first wires BL disposed on the bridge BR may include the same material as the material included in the second conductive layer.

According to an exemplary embodiment of the present inventive concept, the first wires BL disposed on the bridge BR include a material having a high elongation such that a defect such as cracks or disconnection of the first wires BL do not occur.

In the island IS, the first conductive layer may be formed of a material having different electrical/physical characteristics from the first wires BL although the first conductive layer has a lower elongation than the first wires BL, thereby improving an efficiency of electrical signal transmission or reducing an incidence of defects in a manufacturing process.

For example, the first conductive layer disposed on the island IS may include molybdenum, and the second conductive layer and the first wires BL may include aluminum.

In addition, according to an exemplary embodiment of the present inventive concept, after the second protection layer 195 including an organic material is formed so as to cover the edge of the inorganic insulating layer and the bridge BR, the first wire BL is formed on the second protection layer 195.

The first wire BL may be formed simultaneously with the same material as the second conductive layer (e.g., a source electrode or a drain electrode of a transistor). After forming a conductive layer on the entire surface of the base layer, the first wire BL may be formed by patterning the conductive layer.

In the case where the organic material layer does not cover an inner surface of the opening OA of the inorganic insulating layer, a conductive material may remain in the buffer layer 120, the gate insulating layer 140, the interlayer insulating layer 160, and the like without being removed when patterning the conductive layer. In this case, the remaining conductive material may cause a short between other conductive layers.

A structure of the second bridge to the fourth bridge BR2 through BR4 may be similar to a structure of the first bridge BR1 described above. That is, an inorganic insulating layer may be removed in the second bridge to the fourth bridge BR2 through BR4, and the first wires BL may be disposed on an organic material layer. The number of the first wires BL disposed in the second bridge to the fourth bridge BR2 through BR4 may be the same as or different from the number of the first wires BL disposed in the first bridge BR1.

Figure 12:
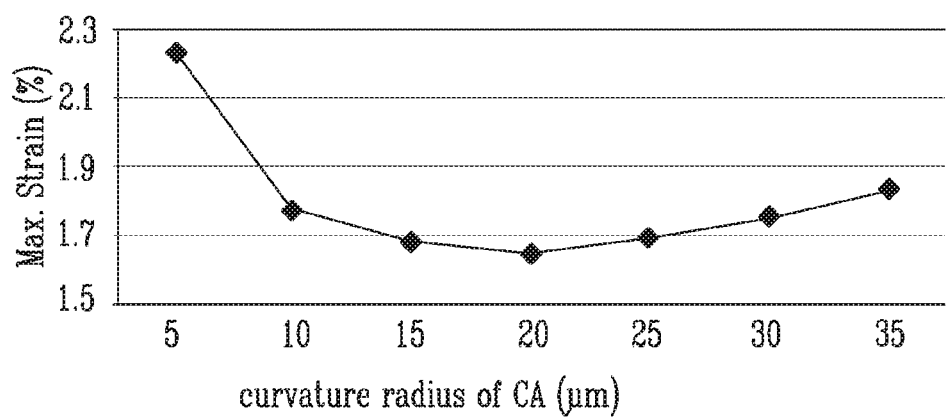
FIG. 12 is a graph illustrating strain of a bridge according to a curvature radius of a curved portion shown in FIG. 4.

FIG. 12 is a graph illustrating strain of a bridge according to a curvature radius of a curved portion shown in FIG. 4. Particularly, with reference to a case where a first length L1 from an outer side of the first bridge BR1 to an outer side of the third bridge BR3 is 420 um and a second length L2 from an outer side of the second bridge BR2 to an outer side of the fourth bridge BR4 is 420 um, FIG. 12 illustrates the maximum strain of the bridge BR measured when the bridge BR, which includes the curved portion CA having a curvature radius of 5 um to 35 um, is stretched.

Referring to FIG. 4, each bridge BR may include a curved portion CA.

The curved portion CA may be disposed on one side of the island IS and may be curved to have a predetermined curvature radius.

When the base layer 110 is stretched, the bridge BR is deformed, and the strain of the bridge BR may vary depending on the curvature radius of the curved portion CA.

Referring to FIG. 12, in the case where the curvature radius is in a range of 15 um to 25 um, the maximum strain of the bridge BR is low.

Specifically, the maximum strain decreases as the curvature radius increases from 5 um to 20 um, and the maximum strain increases as the curvature radius increases from 20 um to 35 um.

The higher the strain of the bridge BR, the higher a possibility of occurrence of defects such as cracks in the structures (the first protection layer 190, the first wires BL, the second protection layer 195, etc.) formed on the bridge BR. On the contrary, the lower the strain of the bridge BR, the lower a possibility of occurrence of defects such as cracks in the structures formed on the bridge BR.

That is, the curved portion CA included in the bridge BR may be formed to have a curvature radius of 15 um to 25 um Meanwhile, referring to FIG. 12 showing the optimum curvature radius in the case where the first length L1 from an outer side of the first bridge BR1 to an outer side of the third bridge BR3 is 420 um and the second length L2 from an outer side of the second bridge BR2 to an outer side of the fourth bridge BR4 is 420 um, a range of the optimum curvature radius of the curved portion CA may be smaller than 15 um to 25 um when a size of the islands IS and the bridges BR1 through BR4 decreases.

On the contrary, a range of the optimum curvature radius of the curved portion CA may be larger than 15 um to 25 um when a size of the islands IS and the bridges BR increases.

Figure 13:
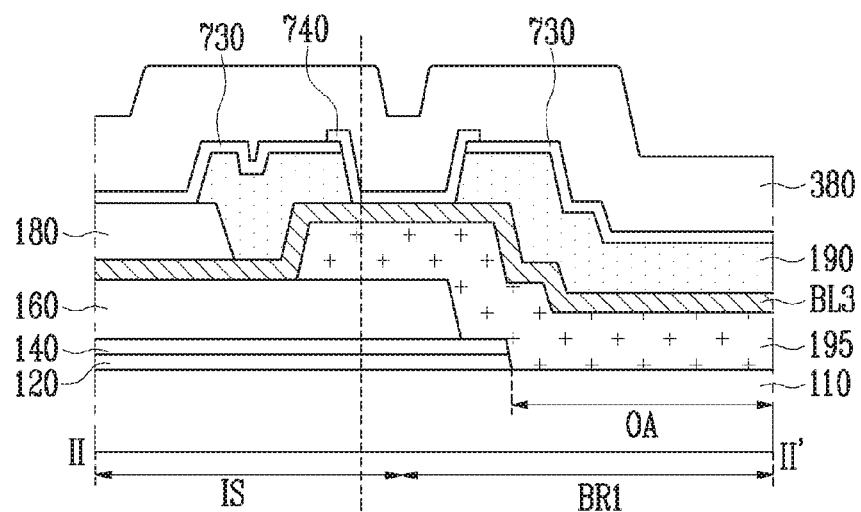
FIG. 13 is a cross-sectional view taken along a line II-II' of FIG. 4, illustrating other exemplary embodiment of the present inventive concept.
Figure 14:
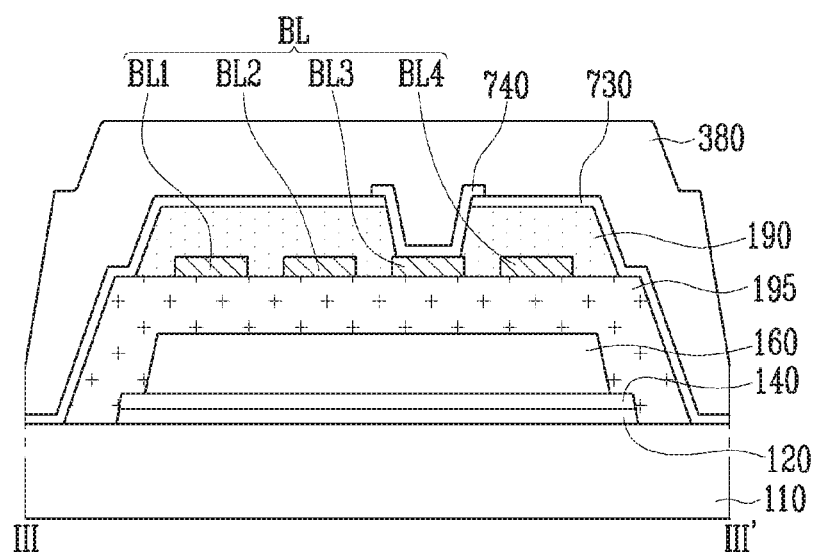
FIG. 14 is a cross-sectional view taken along a line III-III' of FIG. 4, illustrating other exemplary embodiment of the present inventive concept.

FIG. 13 is a cross-sectional view taken along a line II-II' of FIG. 4, FIG. 14 is a cross-sectional view taken along a line III-III' of FIG. 4, and FIGS. 13 and 14 are diagrams illustrating other exemplary embodiment of the present inventive concept.

Referring to FIGS. 13 and 14, the first wires BL may include the first wire BL3 for transmitting the second power ELVSS.

A wire contact portion 740 may be formed in the first protection layer 190 and the wire contact portion 740 may be disposed in a contact hole exposing a portion of the first wire BL3. The wire contact portion 740 may be disposed on the bridge BR, and in some cases, a portion of the wire contact portion 740 may be disposed on the island IS.

The second pixel electrode 730 may be connected to the wire contact portion 740 through the first wire BL3.

Figure 15:
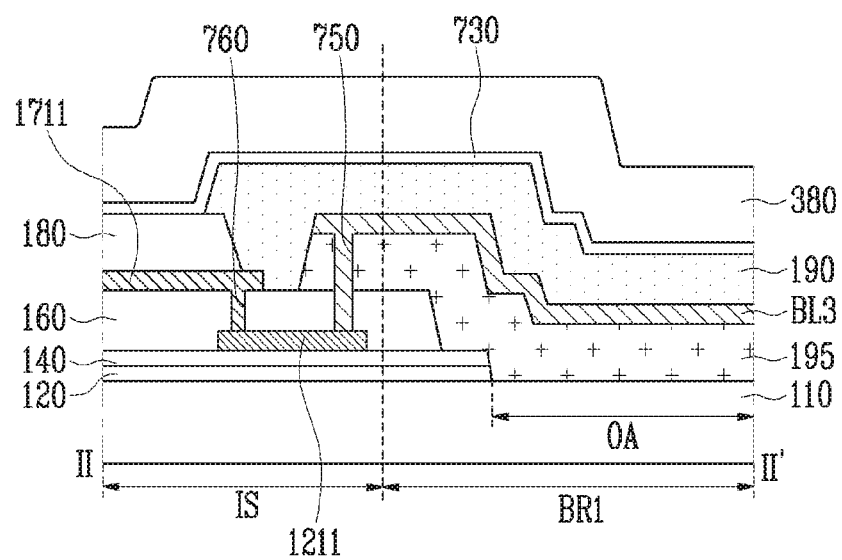
FIG. 15 is a cross-sectional view taken along a line II-II' of FIG. 4, illustrating other exemplary embodiment of the present inventive concept.

FIG. 15 is a cross-sectional view taken along a line II-II' of FIG. 4, illustrating other exemplary embodiment of the present inventive concept.

The first wires BL may be disposed only on the second protection layer 195, unlike the case where the first wires BL are disposed so as to extend to the interlayer insulating layer 160 through the second protection layer 195.

A contact hole 750 may be formed in the second protection layer 195 and the interlayer insulating layer 160 to expose a portion of a gate wire 1211 disposed on the gate insulating layer 140.

The first wires BL may be electrically connected to the gate wire 1211 through the contact hole 750.

The first data line 1711 may be disposed on the interlayer insulating layer 160, and a contact hole 760 may be formed in the interlayer insulating layer 160 to expose a portion of the gate wire 1211 in the island IS.

The first data line 1711 may be electrically connected to the gate wire 1211 through a contact hole 760. In addition, the first data line 1711 and the first wire BL may be electrically connected to the gate wire 1211 through the contact hole 750 and 760, respectively.

That is, the first wires BL formed on the bridge BR1 may be connected to wires/electrodes disposed on the interlayer insulating layer 160 of the island IS, via wires disposed on the gate insulating layer 140 of the island IS.

Meanwhile, the gate wire 1211 may be connected to the gate line 121 or may be patterned separately from the gate line 121 for contact with the first wire BL.

The gate wire 1211 may be formed of the same material in the same layer as the electrodes/wires formed on the gate insulating layer 140.

The first data line 1711 may be connected to the data line 171 or may be connected to the driving voltage line 172, the source electrode/the drain electrode.

The first data line 1711 may be formed of the same material in the same layer as the electrodes/wires formed on the interlayer insulating layer 160.

Figure 16A:
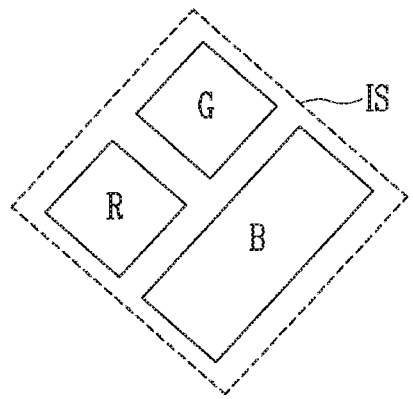
FIGS. 16A, 16B and 16C are diagrams exemplarily illustrating arrangement relationships of pixels disposed on an island.
Figure 16B:
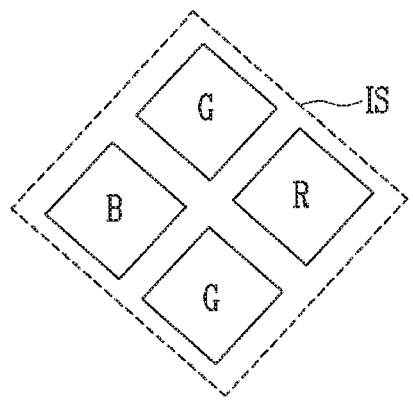
Figure 16C:
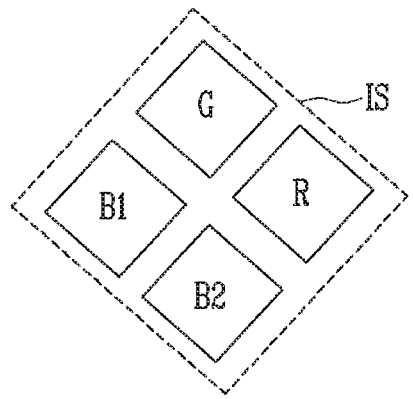

FIGS. 16A to 16C are diagrams exemplarily illustrating arrangement relationships of pixels disposed on an island.

According to an exemplary embodiment of the present inventive concept, a plurality of pixels PXL may be disposed on each island IS. Each pixel PXL may include a red pixel R, a green pixel G, and a blue pixel B, and the pixels PXL may be arranged in various forms.

Referring to FIG. 16A, one red pixel R, one green pixel G, and one blue pixel B may be disposed on one island IS.

Referring to FIG. 16B, one red pixel R, one blue pixel B, and two green pixels G may be disposed on one island IS. The two green pixels G may be arranged in a vertical direction, the red pixel R and the blue pixel B may be arranged in a horizontal direction.

Referring to FIG. 16C, one red pixel R, one green pixel G, a first blue pixel B1, and a second blue pixel B2 may be disposed on one island IS.

In this case, the first blue pixel B1 and the second blue pixel B2 may represent blue series having different wavelengths.

The pixel PXL is shown as one of a red pixel R, a green pixel G, and a blue pixel B in FIGS. 16A to 6C, but the present inventive concept is not limited thereto. For example, the pixel PXL may represent other colors besides red, green, and blue. In addition, the number of pixels PXL disposed on the island IS may be variously changed depending on the case.

Figure 17:
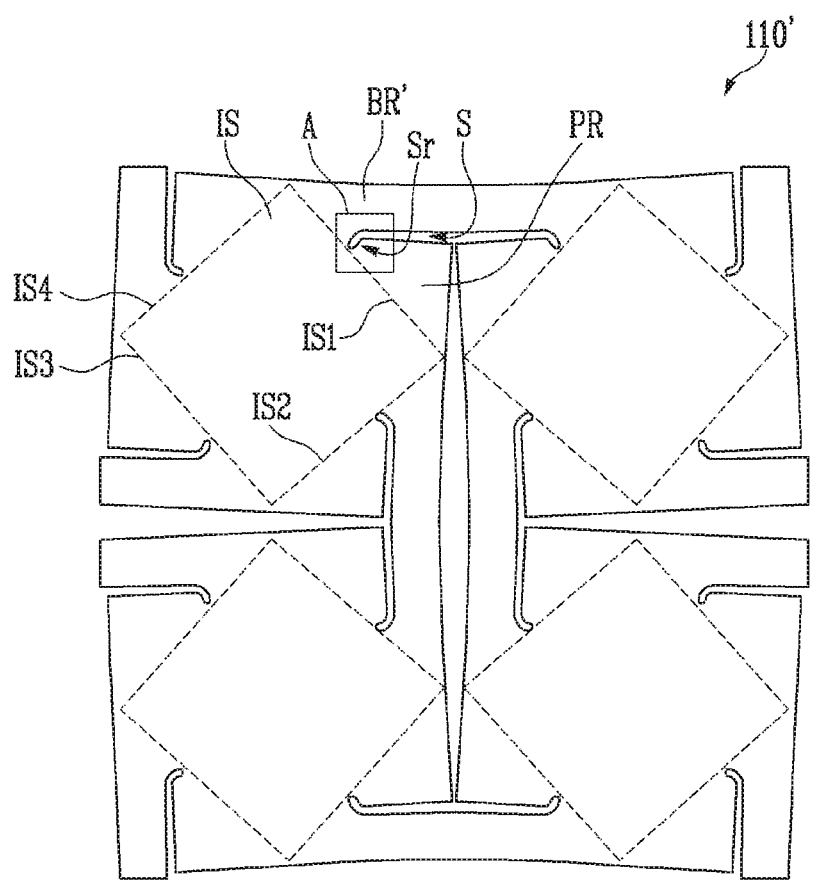
FIG. 17 is a plan view illustrating a base layer of an OLED display according to other exemplary embodiment of the present inventive concept.

FIG. 17 is a plan view illustrating a base layer of an OLED display according to other exemplary embodiment of the present inventive concept.

Referring to FIG. 17, a base layer 110' according to other embodiment of the present inventive concept may have a form of an island.

Specifically, a plurality of islands IS may be regularly arranged in a first axis (an x axis) direction and a second axis (a y axis) direction.

The above-described pixel PXL may be disposed on each island IS, and one pixel PXL or a plurality of pixels PXL may be disposed on each island IS.

The island IS may be surrounded by a first side to a fourth side IS1 through IS4, and a bridge BR' and a peripheral region PR may be disposed at each side IS1 through IS4 of the island.

The bridge BR' may connect adjacent islands IS, and wires for supplying power, a data signal, a scan signal, and the like to the pixel PXL may be formed on each bridge BR'.

When the base layer 110' is stretched, a distance between the islands IS may be increased or decreased. In this case, a shape of each island IS may not be varied. That is, a width and a height of the island IS may not be increased or decreased.

Therefore, a structure of the pixel PXL disposed on the island IS may be not varied.

However, the bridges BR' connecting the islands IS may be varied when the base layer 110' is stretched.

A slit S may be formed between the bridge BR' disposed on one side IS1 through IS4 of the island IS and the peripheral region PR. The slit S may include a curved portion Sr disposed at one end thereof.

An elongation may be controlled by adjusting a thickness of the bridge BR', a length of the slit S, a width of the slit S, and the like.

Figure 18:
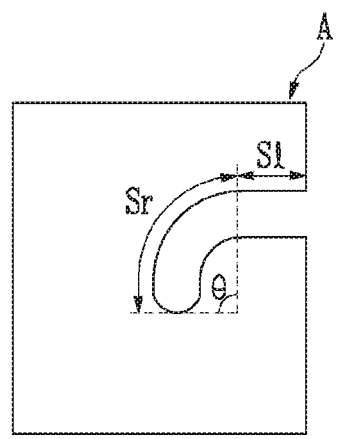
FIG. 18 is an enlarged view of an area A shown in FIG. 17.

FIG. 18 is an enlarged view of an area A shown in FIG. 17.

The slit S formed between the bridge BR' and the peripheral region PR may include a straight portion Sl and a curved line portion Sr. The straight portion Sl may extend in one direction.

The curved portion Sr may be disposed at one end of the straight portion Sl and may be curved to have a predetermined curvature. An angle θ between both ends of the curved portion Sr may vary depending on a curvature radius or a length of the curved portion Sr.

When the base layer 110 is stretched, the bridge BR' may be deformed, and a strain of the bridge BR' may vary depending on the magnitude of the angle θ.

Figure 19:
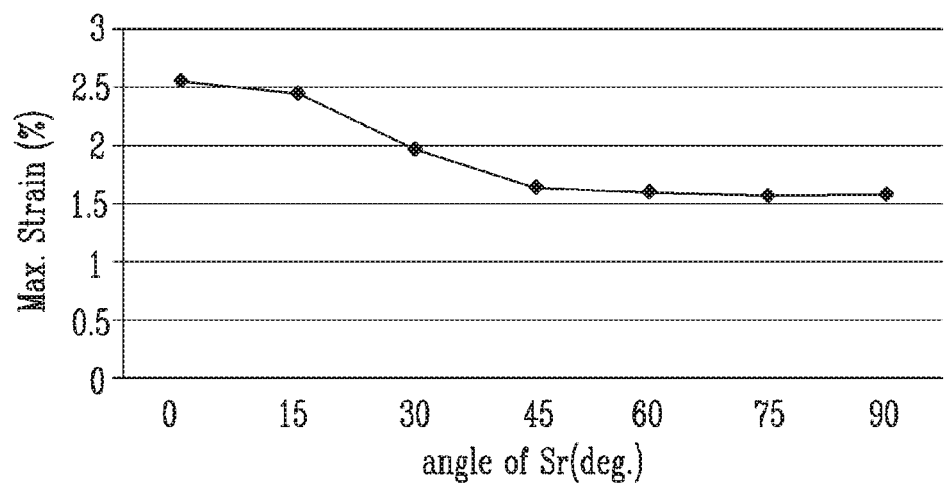
FIG. 19 is a graph illustrating strain of a bridge according to a shape of a curved portion shown in FIG. 18.

FIG. 19 is a graph illustrating strain of a bridge according to a shape of a curved portion shown in FIG. 18. Particularly, FIG. 19 illustrates the maximum strain of the bridge BR' measured when the bridge BR', which includes the slit S having an angle of 0 degree to 90 degrees in shown in FIG. 18, is stretched.

Referring to FIG. 19, in the case where the angle θ between both ends of the curved portion Sr is zero (i.e., no curved portion exists in the slit S), the maximum strain thereof is the largest.

As the angle θ between both ends of the curved portion Sr increases from 0 degree to 45 degrees, the maximum strain of the bridge BR' decreases.

In the case where the angle θ between both ends of the curved portion Sr are 45 degrees to 90 degrees, the maximum strain of the bridge BR' are almost constant.

The higher the strain of the bridge BR', the higher a possibility of occurrence of defects such as cracks in the structures (the first protection layer 190, the first wires BL, the second protection layer 195, etc.) formed on the bridge BR'. On the other hand, the lower the strain of the bridge BR', the lower a possibility of occurrence of defects such as cracks in the structures formed on the bridge BR'.

That is, the slit S may be formed such that the angle θ between both ends of the curved portion Sr is 45 degrees to 90 degrees.

Those with ordinary skill in the technical field of the present inventive concept pertains will be understood that the present inventive concept can be carried out in other specific forms without changing the technical idea or essential features.

Therefore, exemplary embodiments described above should be construed to be exemplified and not to be limited in all aspects.

The scope of the present inventive concept is defined by the appended claims rather than the foregoing description and the exemplary embodiments described therein, and various modifications made within the meaning of an equivalent of the claims of the invention and within the claims are to be regarded to be in the scope of the present inventive concept.

What is claimed is:

1. A display device comprising:
   a base layer including a plurality of islands in which a pixel is disposed, and a plurality of bridges disposed around each of the plurality of islands;
   an inorganic insulating layer disposed on the base layer and having an opening exposing a portion of the bridge;
   an organic material layer covering the opening; and
   a plurality of first wires disposed on a bridge of the plurality of bridges and electrically connected to the pixel,
   wherein adjacent islands of the plurality of islands are connected to each other through at least the bridge of the plurality of bridges,
   and the plurality of first wires are disposed on the organic material layer.

2. The display device of claim 1, wherein
   an island of the plurality of islands has a quadrangle shape,
   and the bridge is connected to each side of the island.

3. The display device of claim 2, wherein
   the bridge includes a curved portion disposed at a portion connected to the island.

4. The display device of claim 2, wherein
the base layer further includes a peripheral region connected to one side of the island and spaced apart from a bridge connected to the one side of the island so as to form a slit.

5. The display device of claim 4, wherein
the slit includes a curved portion.

6. The display device of claim 1, wherein
the inorganic insulating layer includes a buffer layer, a gate insulating layer, and an interlayer insulating layer sequentially stacked.

7. The display device of claim 6, wherein
the pixel includes a transistor, and the transistor includes
a semiconductor layer disposed on the buffer layer;
a gate electrode disposed on the gate insulating layer; and
a source electrode and a drain electrode disposed on the interlayer insulating layer.

8. The display device of claim 7, wherein
the plurality of first wires includes the same material as a material included in the source electrode and the drain electrode.

9. The display device of claim 6, further comprising:
a first conductive layer disposed on the gate insulating layer; and
a second conductive layer disposed on the interlayer insulating layer.

10. The display device of claim 9, wherein
the plurality of first wires includes the same material as a material included in the second conductive layer.

11. The display device of claim 9, wherein
an elongation of the second conductive layer is larger than an elongation of the first conductive layer.

12. The display device of claim 1, wherein
the organic material layer covers an edge of the inorganic insulating layer.

13. The display device of claim 12, wherein
the plurality of first wires extends from an upper portion of the organic material layer to an upper portion of the interlayer insulating layer.

14. The display device of claim 9, wherein
the plurality of first wires is disposed only on the organic material layer,
and the plurality of first wires is electrically connected to the second conductive layer through the first conductive layer.

15. The display device of claim 14, wherein
the plurality of first wires is connected to the first conductive layer through a first contact hole, and the first conductive layer is connected to the second conductive layer through a second contact hole.

16. The display device of claim 6, further comprising:
a first protection layer disposed on the interlayer insulating layer and the plurality of first wires.

17. The display device of claim 16, wherein
the pixel further includes an organic light emitting diode (OLED), and the OLED includes
a first pixel electrode disposed on the first protection layer on the interlayer insulating layer;
an organic emission layer disposed on the first pixel electrode; and
a second pixel electrode disposed on the organic emission layer.

18. The display device of claim 17, wherein
the second pixel electrode is integrally formed corresponding to a shape of the base layer, and is connected to at least one of the plurality of first wires through a contact hole formed in the first protection layer on the plurality of first wires.

19. The display device of claim 1, wherein
a first pixel for displaying a first color, a second pixel for displaying a second color, and a third pixel for displaying a third color are disposed on each of the plurality of islands.

20. A display device comprising:
a base layer including a plurality of islands in which pixels are disposed, and a plurality of bridges connecting each of the plurality of islands;
an inorganic insulating layer disposed on the plurality of islands;
organic light emitting diodes provided in each of the pixels and disposed on the inorganic insulating layer;
an organic material layer covering the plurality of bridges;
a plurality of wires disposed on the organic material layer and electrically connected to the pixels; and
an encapsulation layer disposed on the organic light emitting diodes and the plurality of wires.

* * * * *